US008072122B2

(12) United States Patent
Gao et al.

(10) Patent No.: US 8,072,122 B2
(45) Date of Patent: Dec. 6, 2011

(54) SELF-POWERED IMPULSE DETECTION SYSTEM WITH PIEZOELECTRIC ENERGY HARVESTER

(75) Inventors: Ziyang Gao, Hong Kong (HK); Tung Ching Lui, Hong Kong (HK); Xiang Chen, Hong Kong (HK); Ngok Man Sze, Hong Kong (HK)

(73) Assignee: Hong Kong Applied Science and Technology Research Institute Company Limited, New Territories (HK)

( * ) Notice: Subject to any disclaimer, the term of this patent is extended or adjusted under 35 U.S.C. 154(b) by 0 days.

(21) Appl. No.: 13/100,295

(22) Filed: May 3, 2011

(65) Prior Publication Data

US 2011/0204752 A1    Aug. 25, 2011

(51) Int. Cl.
H02N 2/18        (2006.01)
H01L 41/107      (2006.01)
(52) U.S. Cl. .................... 310/339; 310/330; 310/331
(58) Field of Classification Search .......... 310/330–332, 310/339
See application file for complete search history.

(56) References Cited

U.S. PATENT DOCUMENTS

| 3,457,463 A * | 7/1969 | Balamuth ............... 361/184 |
| 7,471,033 B2 * | 12/2008 | Thiesen et al. ............ 310/339 |
| 7,511,404 B2 * | 3/2009 | Lee ......................... 310/339 |
| 7,687,977 B2 * | 3/2010 | Xu ......................... 310/339 |
| 7,808,158 B1 * | 10/2010 | Deeds et al. ............ 310/339 |
| 7,821,183 B2 * | 10/2010 | Rastegar .................. 310/339 |
| 7,898,157 B2 * | 3/2011 | Churchill et al. ........ 310/339 |
| 7,928,634 B2 * | 4/2011 | Fang ....................... 310/339 |
| 8,020,266 B2 * | 9/2011 | Ulm et al. ................ 29/25.42 |
| 8,030,786 * | 10/2011 | Jackson et al. ........... 290/1 R |
| 2007/0267946 A1 * | 11/2007 | Haas et al. ............. 310/339 |
| 2008/0083139 A1 * | 4/2008 | Mullen .................... 36/136 |
| 2008/0174273 A1 * | 7/2008 | Priya et al. .............. 320/114 |
| 2009/0211353 A1 * | 8/2009 | Gao et al. ................ 73/146.5 |
| 2010/0072759 A1 * | 3/2010 | Andosca et al. ......... 290/1 R |
| 2010/0072859 A1 * | 3/2010 | Jager et al. ............ 310/323.21 |
| 2011/0012479 A1 * | 1/2011 | Nakamura et al. ....... 310/339 |
| 2011/0248605 * | 10/2011 | Lee et al. ................ 310/339 |

* cited by examiner

Primary Examiner — Jaydi San Martin
(74) Attorney, Agent, or Firm — Ella Cheong Hong Kong; Margaret Burke; Sam T. Yip

(57) ABSTRACT

A self-powered impulse detecting system comprising a signal transmitter; an energy storage component; and an energy harvester comprising a top plate configured to receive a stress impulse by an external object on its top surface; a bottom plate positioned opposite to the top plate and leaving room in between the bottom plate and the top plate; an elastic element positioned in between the top plate and the bottom plate; a bendable substrate attached at a first end to the bottom surface of the top plate, the bendable substrate is configured to bend freely, colliding with the top plate and a stopper; a piezoelectric element positioned on the bendable substrate; a deadweight attached to a second end of the bendable substrate; wherein collisions between the bendable substrate, the top plate and the stopper cause the bendable substrate to bend along with the piezoelectric element to generate power.

20 Claims, 5 Drawing Sheets

SELF-POWERED IMPULSE DETECTION SYSTEM WITH PIEZOELECTRIC ENERGY HARVESTER

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to energy harvesting devices in general and, more particularly, to energy harvesting devices that can harvest energy from a stress impulse to power impulse detecting systems.

BACKGROUND

Physical impacts or stress impulses commonly exist in daily life such as knocking and closing of doors and stepping on the ground. Stress impulse is characterized as an initial sharp peak followed by a quick attenuation. Although this impulse energy is ephemeral and small, it can still be harvested and re-used. An energy harvester (EH) is a device that converts ambient vibration energy, which would otherwise be wasted, into energy that can be used for a specific purpose. EHs using piezoelectric materials to convert ambient vibration into electrical energy may be used in a wide variety of applications with low power consumption.

For example, in U.S. Pat. No. 6,861,785, a self-powered remote control device having an EH is disclosed. This EH includes a striking means for generating a calibrated amount of mechanical energy for striking directly on a piezoelectric element with a predetermined force. This design, however, is limited to a specific type of striking force and cannot be used in conditions where physical impacts may not be pre-determined and can possibly damage the piezoelectric element when striking directly on it.

Another example of an energy harvester is described in U.S. Pat. No. 7,936,109, the disclosure of which is hereby incorporated by reference in its entirety. U.S. Pat. No. 7,936,109 describes an energy harvesting device that can harvest energy over a range of frequencies, including non-resonant frequencies. However, the energy harvesting devices disclosed in the '109 patent are typically used to harvest energy from continuous vibrations; thus, there is a need in the art for energy harvesting systems useful for converting a stress impulse caused by a physical impact to useful electrical energy.

SUMMARY

The presently disclosed invention includes a piezoelectric energy harvesting system that converts mechanical ambient energy including physical impacts or stress impulses, which would otherwise be wasted, into electricity, which can be used for specific purposes.

In accordance with various embodiments, a piezoelectric energy harvesting system is enclosed in housing having a top plate and a bottom plate. Electricity is generated by first introducing a stress impulse by the impact of an external object to the top plate, causing vibrations of a bendable substrate within the housing. The bendable substrate is in the form of cantilever with one fixed end attached to the top plate. A deadweight is attached to the other end of the bendable substrate. The vibrating bendable substrate then collides with the top plate, causing bending and deformation on the bendable substrate, in turn deforming the piezoelectric element that is attached to the bendable substrate, to generate electricity. Elastic elements, such as resilient, elastomeric materials (e.g., silicones and rubbers), coil springs, and other materials which can store and release mechanical energy, are installed between the top plate and the bottom plate to reduce the overall damping of the whole structure.

A stopper is positioned at the end of the bendable substrate that is not attached to the top plate to generate more collisions when the vibrating bendable substrate oscillates in between the top plate and the stopper. The additional collisions prolong the bending and deformation of the bendable substrate and the piezoelectric element to further harvesting energy from the vibration. The stopper also prevents over deformation to the bendable substrate.

By varying the length of the bendable substrate and/or the weight of the deadweight attached to the end of the bendable substrate, the resonant frequency of the piezoelectric energy harvesting system can be tuned to match the first or the second resonant frequency of the top plate to achieve better conversion efficiency. Maximum energy conversion efficiency is achieved when the resonant frequency of the piezoelectric energy harvesting system overlaps with that of the stress impulse impact surface, in this embodiment the top plate.

Elastic elements, such as resilient, elastomeric materials (e.g., silicones and rubbers), coil springs, and other materials which store and release mechanical energy, are used to reduce the system's overall damping effect. The use of these techniques results in the improvement in energy conversion efficiency. Consequently, broader applications of the presently disclosed electrical power source can be found and lesser reliance on carbon emitting power sources is possible.

Another embodiment in the present application utilizes a plurality of bender elements with different resonant frequencies, arranged in an array, to broaden the overall response bandwidth of the energy harvesting system.

In another embodiment, the piezoelectric energy harvesting system is used to power an impact detecting system. The impact detecting system includes a number of detecting nodes, each transmitting signals to a receiver. Each node is powered by an independent piezoelectric energy harvester.

Once a stress impulse is applied to a node, the impact source will be detected by the piezoelectric material and at the same time be converted into electrical energy to power the corresponding transmission node. Since the output power of the energy harvester is typically too low (<1 mW) to provide a continuous and stable output, a storage component is generally included to store the energy. When the stored energy reaches a desired energy level, the system can be triggered to release the stored energy to a functional module.

Power consumption of a typical infrared (IR) transmission is more than 0.8 mJ. Since the total amount of the harvested energy from each impact may be very low and unstable, a simple and ultra-low power transmission protocol is used, including a very short header, a particular transmission time interval of a data packet is, and an end bit of the data packet. Repeated transmission is adopted, so that the end bit of the current data packet is the header of the next one. By introducing such an ultra-low power transmission protocol, the harvested energy from each impact is sufficient to transmit the signal carrying the data packet.

The piezoelectric energy harvesting system can be utilized with other existing ultra-low power communication protocols. One such ultra-low power communication protocol is described in Lizhi Charlie Zhong, Rahul Shah, Chunlong Guo, Jan Rabaey, *An Ultra-low Power and Distributed Access Protocol for Broadband Wireless Sensor Networks*, University of California at Berkeley, content of which is hereby incorporated by reference in its entirety.

BRIEF DESCRIPTION OF THE DRAWINGS

Embodiments of the invention are described in more detail hereinafter with reference to the drawings, in which.

DETAILED DESCRIPTION

In the following description, systems and apparatus of self-powered impulse detecting systems and the like are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
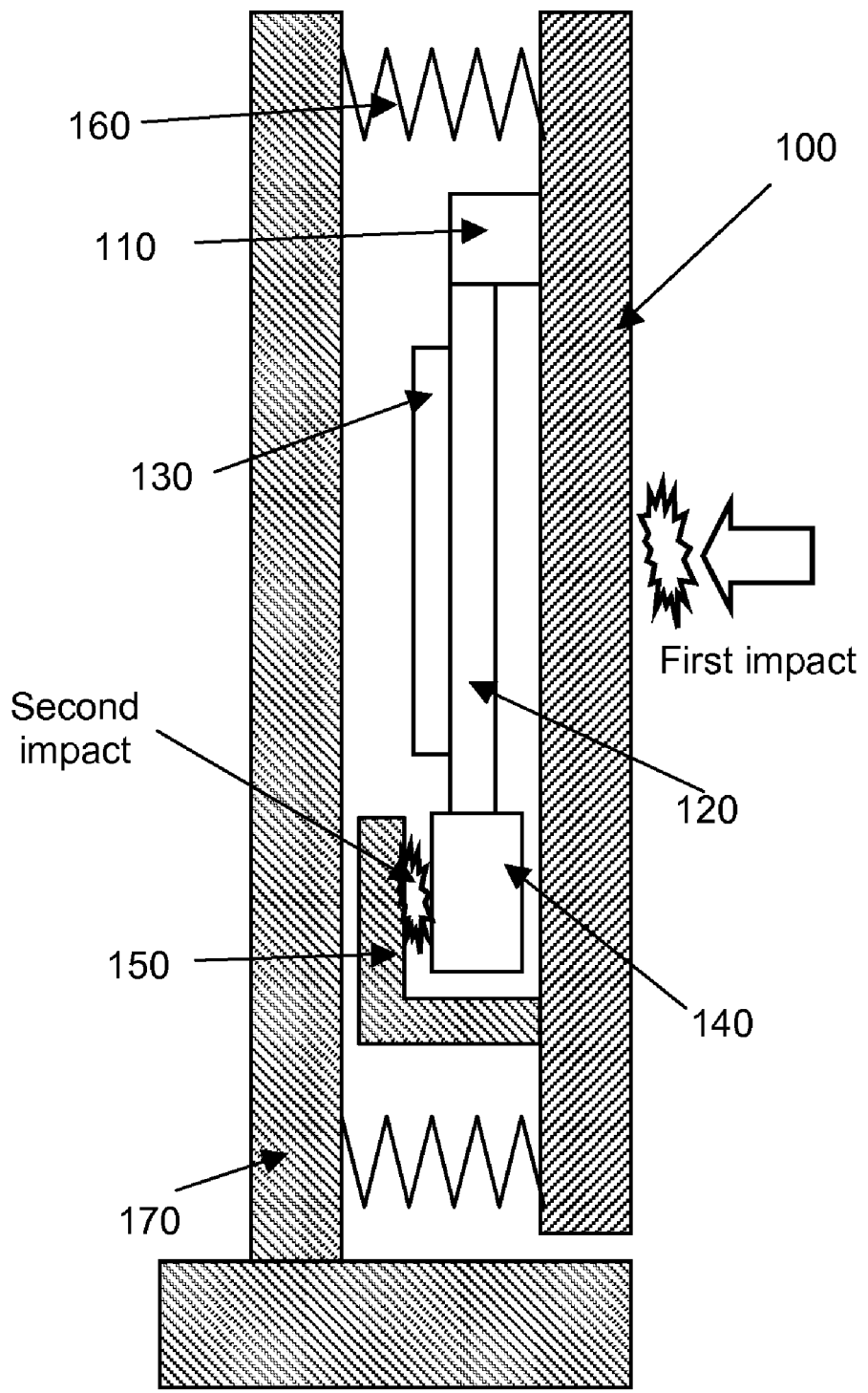
FIG. 1 shows a side view of one embodiment of a piezoelectric energy harvesting system having a single bendable substrate.

Referring to FIG. 1, the overall structure of a piezoelectric energy harvesting system in accordance with various embodiments is schematically depicted. Electricity is generated by first introducing a stress impulse by the impact of an external object to the top plate 100, causing vibrations of the bendable substrate 120. The vibrating bendable substrate 120 then collides with the top plate 100, causing bending and deformation on the bendable substrate 120, in turn deforming the piezoelectric element 130 that is attached to the bendable substrate 120, generating electricity. The bendable substrate 120 is in the form of cantilever with one fixed end 110 attached to the top plate 100. A deadweight 140 is attached to the other end of the bendable substrate 120. Elastic elements 160, such as resilient, elastomeric materials (e.g., silicones and rubbers), coil springs, and other materials which can store and release mechanical energy, are installed between the top plate 100 and the bottom plate 170 to reduce the overall damping of the whole structure. While coil springs are schematically depicted to represent elastic element 160, it is understood that this merely represents the elastic material discussed above.

Stopper 150 is introduced to generate more collisions when vibrating bendable substrate 120 oscillates in between the top plate 100 and the stopper 150. The additional collisions prolong the bending and deformation of the bendable substrate 120 and the piezoelectric element 130 to further harvest energy from the vibration. The stopper 150 also prevents over deformation to the bendable substrate 120.

By varying the length of the bendable substrate 120 and/or the weight of the deadweight 140 attached to the end of the bendable substrate 120, the resonant frequency of the piezoelectric energy harvesting system can be tuned to match the first or the second resonant frequency of the top plate 100 to achieve better conversion efficiency. The resilient elements 160 and the stoppers 150 further improve the conversion efficiency and a theoretical conversion efficiency as high as 80% can be achieved.

Figure 2:
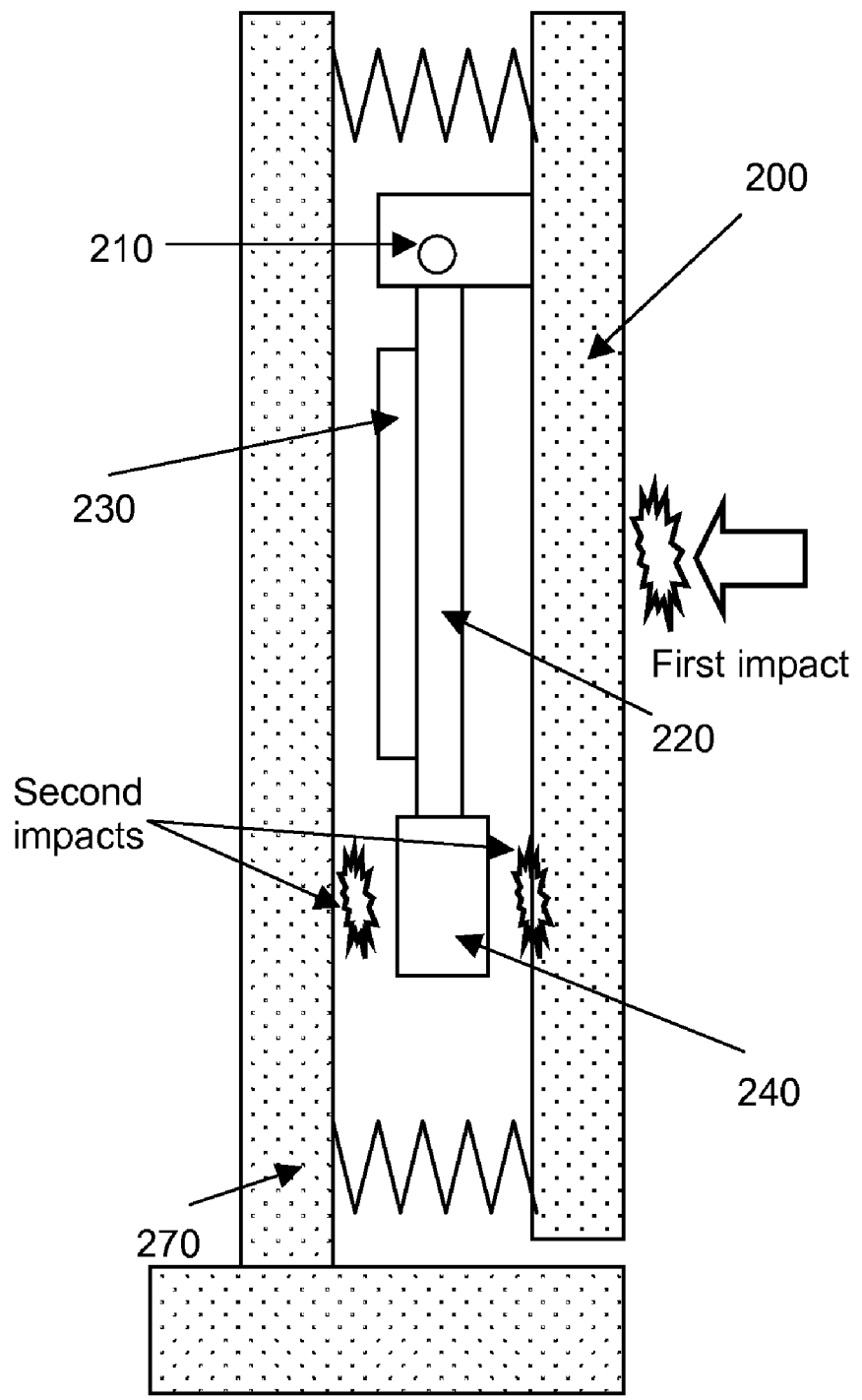
FIG. 2 shows a side view of another embodiment of a piezoelectric energy harvesting system having a single bendable substrate.

FIG. 2 schematically depicts the overall structure of another embodiment of an energy harvesting system of the present invention. A stress impulse is introduced by the impact of an external object to the top plate 200, causing vibrations and swinging of the bendable substrate 220. The bendable substrate 220 is in the form of pendulum with one end secured by the bearing 210, and the other end attached with the deadweight 240. The bendable substrate 220 swings back and forth, colliding with the top plate 200 and the bottom plate 270, inducing deformation of piezoelectric material 230 to generate electricity.

Figure 3:
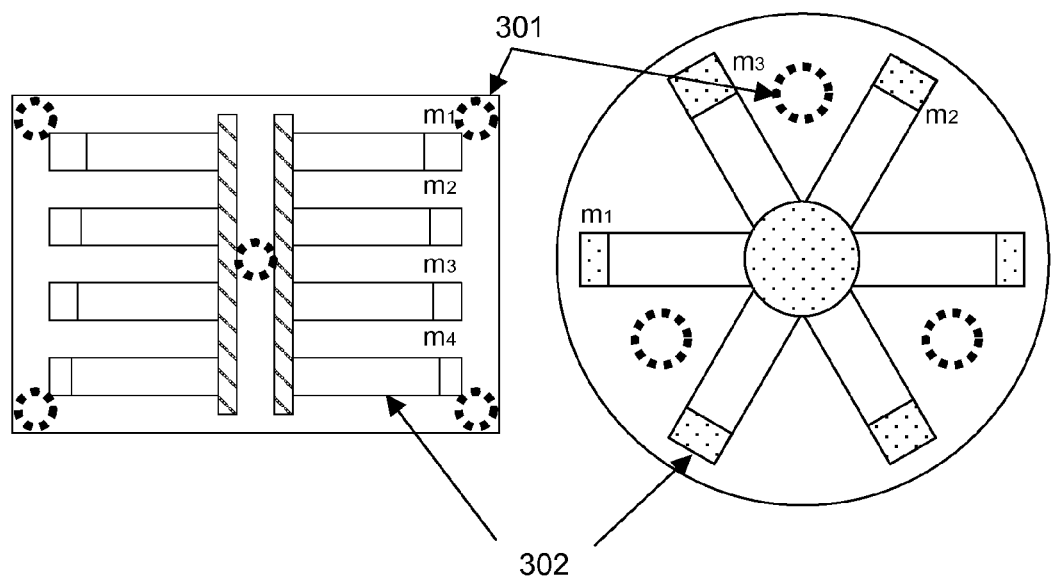
FIG. 3 shows a top view of two embodiments of a piezoelectric energy harvesting system having a plurality of bendable substrates.

FIG. 3 schematically depicts a top view of the overall structure of two exemplary embodiments of an energy harvesting system with a plurality of bendable substrates 302. In these two embodiments, bendable substrates 302 with different resonant frequencies are configured as an area array to increase the amount of harvested energy and to broaden the overall response bandwidth of the system. Other patterns besides circular and row-column placements of bendable substrates can also be adopted.

Figure 4:
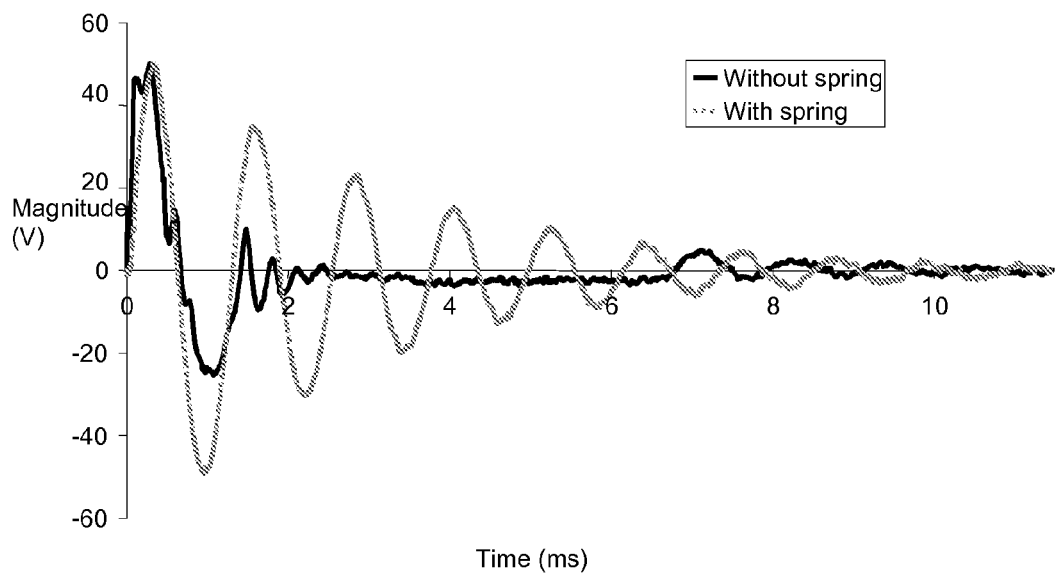
FIG. 4 shows a time-magnitude graph of the measured effect of an elastic element in one embodiment of a piezoelectric energy harvesting system having elastic elements.

FIG. 4 shows a time-magnitude graph of the measured effect of an elastic element in a piezoelectric energy harvesting system. Coil springs are used as the elastic elements in the measurements of FIG. 4. The presence of elastic elements can effectively reduce the overall damping of the whole structure, and in turn harvest more energy from the ambient vibration. As can be seen in the time-magnitude graph, an energy harvester without elastic element and a piezoelectric energy harvesting system with elastic element generate about the same amount of electricity after a single stress impulse. But the electricity generation of the energy harvester without an elastic element quickly dissipates whereas the piezoelectric energy harvesting system with an elastic element continues to generate a transient electricity with gradually decreasing magnitude.

Figure 5:
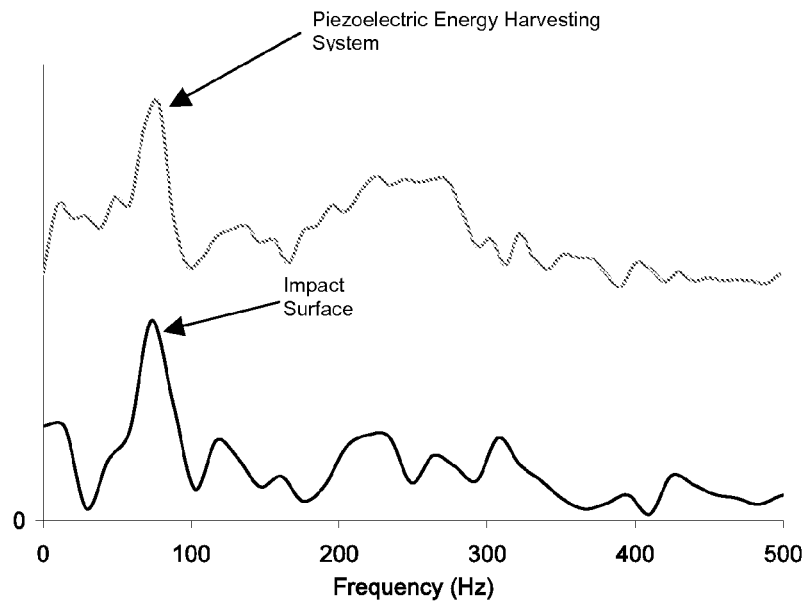
FIG. 5 shows a frequency-magnitude graph of the measured vibration spectrums of the top plate and the EH system comparatively in frequency domain.

FIG. 5 shows the measured vibration spectrums of a stress impulse impact surface and the entire structure of a piezoelectric energy harvesting system comparatively in the frequency domain. Maximum energy conversion efficiency is achieved when the resonant frequencies of the piezoelectric energy harvesting system and the stress impulse impact surface overlap. In accordance with various embodiments, the length of the bendable substrate and the weight of the deadweight of the piezoelectric energy harvesting system are adjustable to match the resonant frequency of the piezoelectric energy harvesting system to the first or the second resonant frequency of the stress impulse impact surface.

Figure 6:
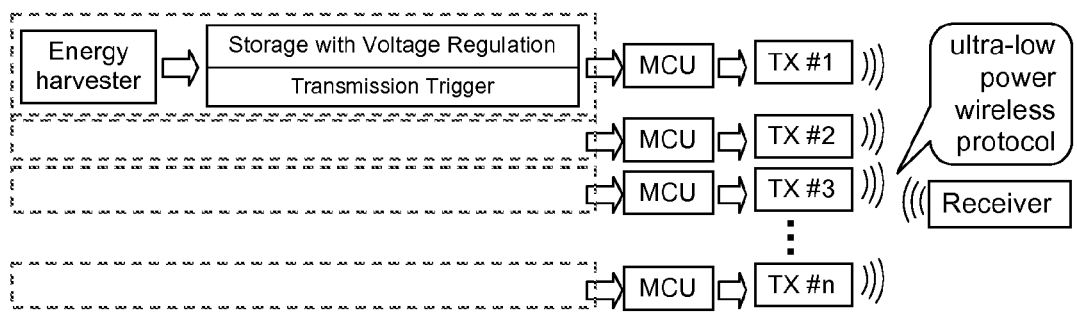
FIG. 6 illustrates a schematic diagram of an embodiment of a self-powered impulse detecting system.

Referring to FIG. 6, a piezoelectric energy harvesting system is used to power a wireless detecting system. The wireless detecting system includes a number of detecting nodes, each transmitting signals to a receiver. Each node is powered by an independent piezoelectric-based energy harvester. Once a stress impulse is applied to a node, the impact source will be detected by the piezoelectric material and at the same time be converted into electricity to power the corresponding transmission node. Since the output power of the energy harvester is typically too low (<1 mW) to provide a continuous and stable output, a storage component, such as a capacitor or a battery, is optionally used to store the harvested electrical energy. When the stored energy reaches the desired energy level, the system can be triggered, by a voltage monitor, to release the energy to the functional module. The functional module includes a micro-processor (MCU) controlling the signal transmission of the transmitter. In order to effectively utilize the low harvested power to achieve a successful transmission, an ultra-low power wireless protocol is used to minimize the required energy of each transmission. Of course, it is understood that, depending upon the magnitude of the impact and the size and configuration of the harvester, a stress impulse can be sufficient to directly power a signal transmission.

In an exemplary embodiment, the transmitter can be an IR transmitter; however, it is understood that any transmitter that can transmit a low power wireless signal can be selected for use in the system of the present invention including those using rf frequencies for transmission.

Power consumption of a typical wireless communication, such as an infrared (IR) transmission, is more than 0.8 mJ. Since the total amount of the harvested energy from each impact may be very low and unstable, a simple and ultra-low power transmission protocol is used.

Figure 7:
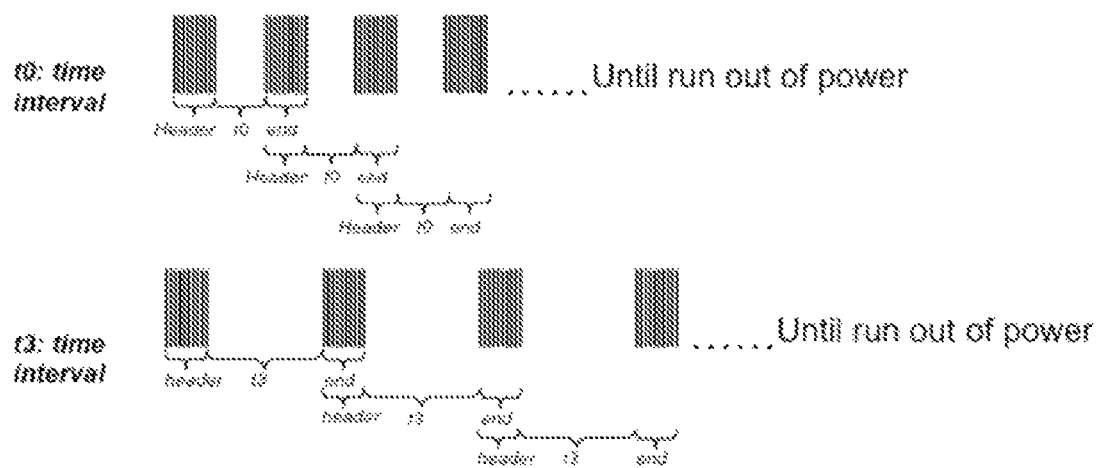
FIG. 7 illustrates two exemplary embodiments of an ultra-low power transmission protocol.

Referring to FIG. 7, each bit of a transmitted signal is transmitted by an IR transmitter with 6-10 cycles in a frequency of 38/40 kHz, which is compatible with the data signal decoding scheme of a standard IR receiving module. The end bit of the current transmitted signal is the header bit of next transmitted signal. Each transmitted signal is transmitted over a particular time interval. The signal is sent out repeatedly to ensure the IR receiving module can at least receive one complete cycle even with an unknown input energy in the overall transmission process.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A self-powered impulse detecting system comprising:
a signal transmitter;
an energy storage component electrically communicating with the signal transmitter; and
an energy harvester comprising:
a top plate having a top surface and a bottom surface, the top plate configured to receive a stress impulse by an external object on its top surface;
a bottom plate positioned opposite to the top plate and leaving room in between the bottom plate and the top plate;
an elastic element positioned in between the top plate and the bottom plate, the elastic element is configured to reduce overall damping of the energy harvester;
a bendable substrate attached at a first end to the bottom surface of the top plate, the bendable substrate is configured to bend freely;
a piezoelectric element positioned on the bendable substrate;
a deadweight cooperating with the bendable substrate; and
a stopper positioned at a second end of the bendable substrate, the stopper configured to cause the bendable substrate to collide with the stopper when the bendable substrate bends towards the stopper;
wherein collisions between the bendable substrate, the top plate and the stopper cause the bendable substrate to bend along with the piezoelectric element to generate electricity, such that the electricity generated by the energy harvester powers the signal transmitter through the energy storage component to transmit a signal.

2. The self-powered impulse detecting system of claim 1, wherein length of the bendable substrate of the energy harvester is adjustable.

3. The self-powered impulse detecting system of claim 1, wherein weight of the deadweight of the energy harvester is adjustable.

4. The self-powered impulse detecting system of claim 1, wherein length of the bendable substrate of the energy harvester and weight of the deadweight of the energy harvester are adjustable for tuning resonant frequency of the energy harvester to match resonant frequency of the top plate.

5. The self-powered impulse detecting system of claim 1, wherein the deadweight is attached to the bendable substrate.

6. The self-powered impulse detecting system of claim 1, wherein the energy harvester further comprising a plurality of elastic elements, each of the elastic elements positioned in between the top plate and the bottom plate.

7. The self-powered impulse detecting system of claim 1, wherein the energy harvester further comprising a plurality of bendable substrates.

8. The self-powered impulse detecting system of claim 7, wherein each of the bendable substrates having a different resonant frequency.

9. The self-powered impulse detecting system of claim 7, wherein the energy harvester further comprising a plurality of stoppers, each of the stoppers configured to cause each of the bendable substrates to collide with the respective stopper when each of the bendable substrates bends towards the respective stopper.

10. The self-powered impulse detecting system of claim 7, wherein the energy harvester further comprising a plurality of deadweights, each of the deadweights is attached to each of the bendable substrates.

11. A self-powered impulse detecting system comprising:
a signal transmitter;
an energy storage component; and
an energy harvester comprising:
a top plate having a top surface and a bottom surface, the top plate configured to receive a stress impulse by an external object on the top surface;
a bottom plate positioned opposite to the top plate and leaving room in between the bottom plate and the top plate;
an elastic element positioned in between the top plate and the bottom plate;
a bendable substrate connected to a bearing attached to the bottom surface of the top plate, the bendable substrate is configured to swing freely;
a piezoelectric element positioned on the bendable substrate;
a deadweight cooperating with the bendable substrate; and wherein collisions between the bendable substrate, the top plate and the bottom plate cause the bendable substrate to bend along with the piezoelectric element to generate electricity, such that the electricity generated by the energy harvester powers the signal transmitter through the energy storage component to transmit a signal.

12. The self-powered impulse detecting system of claim 11, wherein length of the bendable substrate of the energy harvester is adjustable.

13. The self-powered impulse detecting system of claim 11, wherein weight of the deadweight of the energy harvester is adjustable.

14. The self-powered impulse detecting system of claim 11, wherein length of the bendable substrate of the energy harvester and weight of the deadweight of the energy harvester are adjustable for tuning resonant frequency of the energy harvester to match resonant frequency of the top plate.

15. The self-powered impulse detecting system of claim 11, wherein the deadweight is attached to the bendable substrate.

16. The self-powered impulse detecting system of claim 11, wherein the energy harvester further comprising a plurality of elastic elements, each of the elastic elements is positioned in between and connecting the top plate and the bottom plate.

17. The self-powered impulse detecting system of claim 11, wherein the energy harvester further comprising a plurality of bendable substrates.

18. The self-powered impulse detecting system of claim 17, wherein each of the bendable substrates having a different resonant frequency.

19. The self-powered impulse detecting system of claim 17, wherein the energy harvester further comprising a plurality of deadweights, each of the deadweights is attached to each of the bendable substrates.

20. An energy harvester comprising:
a top plate having a top surface and a bottom surface, the top plate configured to receive a stress impulse by an external object on its top surface;
a bottom plate positioned opposite to the top plate and leaving room in between the bottom plate and the top plate;
an elastic element positioned in between the top plate and the bottom plate, the elastic element is configured to reduce overall damping of the energy harvester;
a bendable substrate attached at a first end to the bottom surface of the top plate, the bendable substrate is configured to bend freely;
a piezoelectric element positioned on the bendable substrate;
a deadweight cooperating with the bendable substrate; and
a stopper positioned at a second end of the bendable substrate, the stopper configured to cause the bendable substrate to collide with the stopper when the bendable substrate bends towards the stopper;
wherein collisions between the bendable substrate, the top plate and the stopper cause the bendable substrate to bend along with the piezoelectric element to generate electricity.

* * * * *